Sept. 18, 1962 A. M. GINDI 3,054,967

FREE-RUNNING PULSE GENERATOR FOR PRODUCING STEEP EDGE OUTPUT PULSES

Filed Dec. 31, 1958

INVENTOR.
ABE M. GINDI

BY Everett A. Gastrell

ATTORNEY

United States Patent Office 3,054,967

Patented Sept. 18, 1962

3,054,967
FREE-RUNNING PULSE GENERATOR FOR PRODUCING STEEP EDGE OUTPUT PULSES

Abe M. Gindi, Poughkeepsie, N.Y., assignor to International Business Machines Corporation, New York, N.Y., a corporation of New York Filed Dec. 31, 1958, Ser. No. 784,135
17 Claims. (Cl. 331—75)

The present invention relates to pulse generators, and more particularly, to pulse generators which employ transistors for developing substantially rectangular output pulses at a preselected repetition rate. Although such generators have various applications, they are particularly useful in computers for timing and switching purposes.

Substantially rectangular output pulses which may have a repetition rate in the kilocycle or in the megacycle ranges are required in the timing circuits of many devices. Difficulties have been encountered with prior transistor pulse generators intended for such timing applications. Some such generators have included circuits wherein the transistors periodically operated in their saturated region or have depended upon a periodic blocking action occasioned by the saturation of transformers. Others have relied upon the cyclic charging and discharging of time-constant networks for establishing the frequency of the generated pulses. The saturation of those elements and the discharging of networks, while necessary in the operation of those generators, created time delays in the cyclic return of the circuits to one of their operating conditions. This not only impaired the steepness of the trailing edge of the generated output pulses but also prevented the pulse generators from operating at as high a frequency as was desired for some applications.

It is an object of the present invention, therefore, to provide a new and improved transistor pulse generator which avoids one or more of the above mentioned disadvantages and limitations of prior such generators.

It is an important object of the invention to provide a new and improved pulse generator employing transistors, the operation of which does not depend upon the saturation of various circuit elements such as those transistors.

It is another object of the present invention to provide a new and improved pulse generator for generating output pulses which have steep edge portions and may be used for precise timing purposes at frequencies above one megacycle.

It is a further object of the invention to provide a new and improved transistor pulse generator which affords stable operation while developing output pulses having a repetition rate in the megacycle range.

It is a further object of the invention to provide a new and improved pulse generator which is relatively simple in construction and inexpensive to manufacture.

In accordance with a particular form of the invention, a free-running rectangular wave pulse generator comprises a regenerative oscillatory system including a single asymmetrically conductive device responsive to supplied currents for generating sustained oscillations having a predetermined frequency. The generator also comprises current-translating means including an asymmetrically conductive device, a common constant-current source connected to the aforesaid devices for supplying current thereto, and means responsive to a characteristic of the aforesaid oscillations for alternately switching substantially the entire current flow from the aforesaid source through individual ones of the devices.

Other objects of the invention will be pointed in the following description and claims and illustrated in the accompanying drawing, which disclose, by way of example, the principle of the invention and the best mode which has been contemplated of applying that principle.

Figures 1, 2, 3:
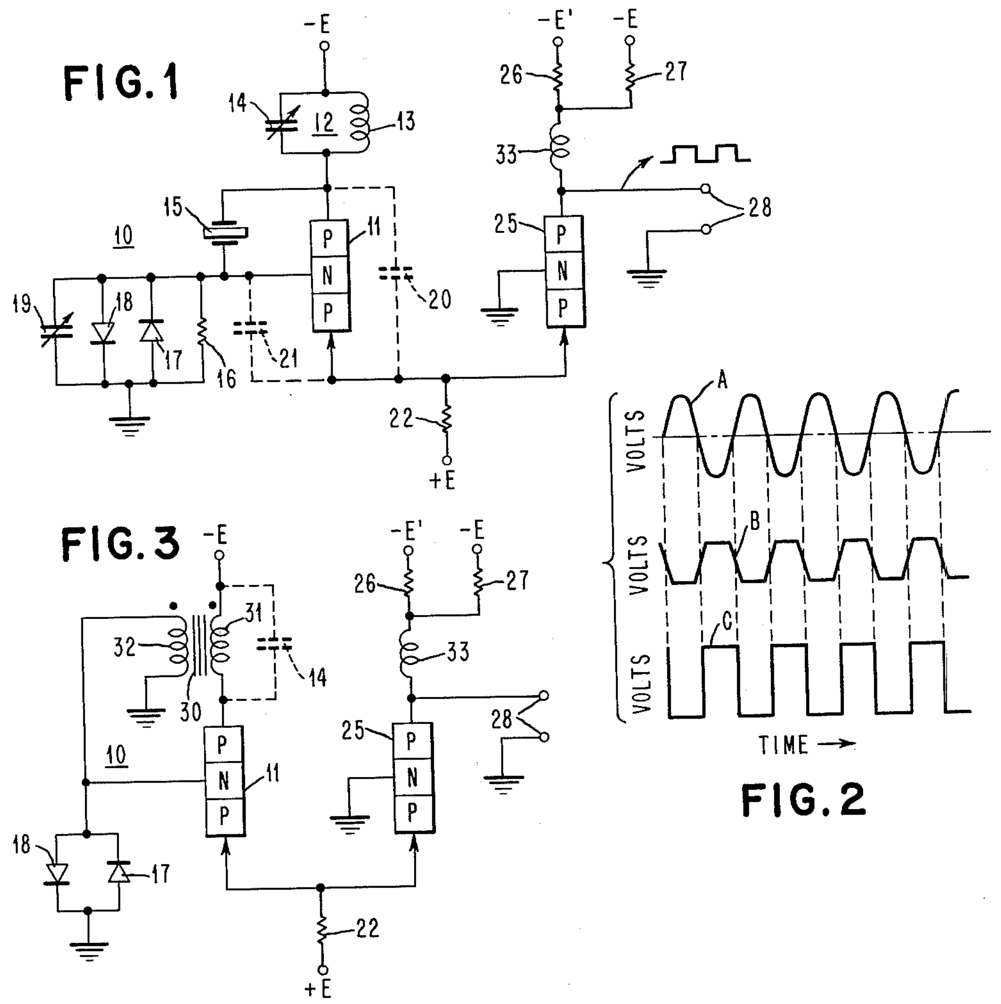
FIGURE 1 is a circuit diagram of a pulse generator in accordance with a particular form of the present invention.
FIGURE 2 is a graph utilized in explaining the operation of the generator of FIGURE 1.
FIGURE 3 is a circuit diagram of a pulse generator in accordance with a modified form of the invention.

*Description of FIGURE 1—Pulse Generator*

Referring now to FIGURE 1 of the drawing, the pulse generator there represented comprises a regenerative oscillatory system 10 including a single asymmetrically conductive device such as a transistor 11 responsive to supplied currents for generating sustained oscillations having a predetermined frequency. Transistor 11 may be of any suitable type such as a junction transistor when operation is to be in the kilocycle range, or it may be a drift transistor, which is characterized by its higher frequency response, for pulse generation in the megacycle range. Transistor 11 is represented as being of the PNP conductivity type although it will be understood that NPN transistors may also be employed in the various circuits of the pulse generator with suitable changes in the polarity of the energizing potentials. A series-resonant piezo electrical crystal 15 effective to establish the operating frequency of the pulse generator is coupled between the collector and the base electrodes of transistor 11. A parallel-resonant circuit 12, which comprises an inductor 13 tuned to resonate at a frequency below that of the crystal 15 by a capacitor 14, which may comprise in whole or in part the distributed capacitance of the inductor, is connected between the collector electrode and the negative terminal of a source designated as —E.

The oscillatory system 10 also includes regenerative feedback means for supplying to the base electrode of transistor 11 a voltage of proper phase to generate sustained oscillations. This feedback means includes the internal collector-emitter capacitance 20 and the internal base-emitter capacitance 21 of the transistor, both of which have been represented in broken-line construction since they are inherent capacitances. To assure adequate feedback when the internal capacitances of the transistor are low, a capacitor 19 may be connected between the base electrode and a point of fixed reference potential such as ground. A pair of asymmetrically conductive devices such as semiconductor diodes 17 and 18 are connected with opposite polarity between the base electrode and ground. For operation at low frequencies such as in the kilocycle range, it is ordinarily desirable to employ a resistor 16 in parallel wih the diodes 17 and 18 to assure vigorous starting of the pulse generator which might otherwise be prevented by the very high impedances afforded by the diodes when the base potential is at substantially ground potential. Also for operation at low frequencies, it may be desirable to employ four diodes, two in each path between the base electrode and ground, the diodes in one path being connected in the same polarity and those in the other path being connected in the opposite polarity. When two diodes in a path are conducting, because of their higher impedance they will provide a somewhat higher voltage between the base electrode and ground than would a single diode in that path, thus assuring that the transistor will continue to respond to the potential at the base electrode. The regenerative oscillatory system 10 may be considered a modified Colpitts-type oscillator wherein the feedback of energy to overcome losses and sustain oscillations is obtained through capacitance coupling elements.

The pulse generator additionally comprises current-translating means including an asymmetrically conductive device such as a second PNP transistor 25 which is preferable of the same type as the transistor 11. The base electrode of transistor 25 is connected directly to ground while the collector electrode is connected through a conventional peaking coil 33 to a reverse biasing potential appearing at the junction of serially connected resistors 26 and 27 of a voltage divider connected across a potential supply indicated as —E′, —E. Output circuit means in the form of a pair of output terminals 28, 28 are connected to the collector electrode of transistor 25 and to the grounded base terminal for supplying periodic pulses of positive polarity having the frequency of the regenerative oscillatory system 10 to a suitable utilizing means (not shown).

The pulse generator further includes a common constant-current source for both of the transistors 11 and 12, this source comprising a relatively large resistor 22 and a battery represented as +E which are selected to supply the emitter current for but one of the transistors at a time. The emitter electrodes of the transistors 11 and 25 are interconnected and in turn connected to the resistor 22. The pulse generator additionally includes means responsive to the polarity of oscillations developed by the regenerative oscillatory system 10 for alternately switching substantially the entire current flow from the described constant-current source through individual ones of the transistors 11 and 25 to develop rectangular output pulses at the output terminals 28, 28. This means comprises the base electrode of transistor 11 and the interconnected emitter electrodes of transistors 11 and 25.

*Explanation of Operation of Pulse Generator of FIGURE 1*

Considering now the operation of the pulse generator, when power is applied to the circuit an initial surge of current through the transistor 11 takes place. This supplies energy which renders the collector more positive than its initial value and shock excites the resonant circuit 12. The instantaneous voltage developed across the resonant circuit is applied to the crystal 15 by the condenser 19 and the applied voltage is in turn divided down by the voltage divider comprising the series-connected internal capacitances 20 and 21 of transistor 11. The instantaneous voltages at the terminals of the piezo-electric crystal 15 are of opposite polarity with respect to that at the emitter electrode. At the instant the collecor electrode of transistor 11 becomes more positive, its base electrode becomes more negative in relation to its emitter. Thus the voltage fed back to the base electrode is in correct phase to render the transistor 11 more heavily conductive. By emitter-follower action, the emitter voltages become more negative and this is in a sense which will reverse bias the emitter-base junction of the transistor 25 and hold it nonconductive.

As previously indicated, the selection of the constant current source comprising the resistor 22 and the supply indicated as +E was such that it is capable of delivering a substantaily constant current corresponding to that translated by only one of either of the transistors 11 and 25 when it is suddenly rendered fully conductive. The magnitude of this current as established by the parameters of the circuits of the two transistors is such that neither of the transistors ever operates in its saturated region.

Curve A of FIGURE 2 represents the sinusoidal wave developed across the tuned circuit 12 as a result of the action explained above. A voltage variation of opposite phase appears at the base electrode of transistor 11 and symmetrical limiting in the well-known manner by the diodes 17 and 18 develops the wave of curve B at the base electrode of that transistor. The diodes are employed with high-speed transistors such as drift transistors to prevent damage to the emitter-base junctions thereof which might be occasioned by too great a voltage excursion on that junction. When alloy-junction transistors are employed, the diodes may be omitted because of the ability of the emitter-base junctions of such transistors to withstand higher voltages. When the oscillations of curve A at the collector of transistor 11 swing negatively, the potential at the base electrode swings positively as represented by curve B, and this momentarily biases the base electrode positively with respect to the emitter electrode and abruptly renders the transistor 11 nonconductive. By the emitter-follower action the base of the transistor 11 becomes momentarily more positive. Since the emitters of the two transistors are interconnected, this biases the emitter-base junction of the transistor 25 in the forward direction and very quickly renders it conductive, thus suddenly switching the entire current from the first current-translating branch circuit including the transistor 11 to the second parallel branch circuit including transistor 25. This in turn causes its collector, and hence the ungrounded one of the output terminals 28, 28, to become more positive. An instant later when the wave of curve B on the base electrode of transistor 11 swings in a negative direction, that transistor is rendered conductive and its emitter, by emitter-follower action, becomes more negative and in turn renders the transistor 25 nonconductive, thus abruptly switching the entire current flow through the path which includes transistor 11. This operation terminates a symmetrical positive-going output pulse as represented by curve C of FIGURE 2 at the output terminals 28, 28 of the pulse generator. The cycle of operation explained above is repeated at a rate determined by the high Q series-resonant crystal 15 in one of the feedback paths of the transistor 11 and there are developed at the output terminals a train of output pulses having steep symmetrical leading and trailing edges and having pulse durations which are substantially equal to the pulse separations.

The transistor pulse generator described above makes use of the technique whereby a well defined or constant current is switched between two parallel current paths by relatively small voltage variations of one or two volts such as those appearing at the base and emitter electrodes of the oscillator transistor. These small voltage variations are effective alternately to switch the current flowing from the constant-current source from one of the current-translating paths to the other. Since the voltage excursions handled by the transistor circuits are small, very little time is lost in charging and discharging inherent or associated circuit capacitances. Thus frequency response is greatly improved. The impedance levels of the circuits of the pulse generator under consideration are low and this in turn reduces the time constants of the networks including those impedances and circuit capacitances. Saturation and the consequent phenomenon of minority-carrier storage in the transistors are avoided by the translation of well defined currents which are outside of the saturation region of the transistors. This tends to minimize "turn off" delay and greatly promotes high-speed switching operation. These factors not only promote high-speed operation but also enhance the generation of pulses with steep leading and trailing edges capable of assuring very precise timing operations.

*Description of Pulse Generator of FIGURE 3*

Referring now to FIGURE 3 of the drawing, there is represented a pulse generator which is generally similar to that represented in FIGURE 1. Accordingly, corresponding elements are designated by these same reference numerals. The pulse generator of FIGURE 3 differs from that of FIGURE 1 in the use of regenerative inductive feedback between the collector and base electrodes of the transistor 11. This inductive feedback is provided by a transformer 30, the primary winding 31 of which is connected between the collector electrode and the source —E while the secondary winding 32 is connected between ground and the base electrode. The polarity of the windings is indicated by the dots in the drawings. The capacitor 14, which is represented in broken-line construction since it may comprise in whole or in part the distributed capacitance of the feedback circuit including the various windings of the transformer, resonates the winding 31 at a frequency which determines the repetition rate of the pulses developed by the pulse generator. For pulse generation at high repetition rates, the pulse generator of FIGURE 3 preferably employs high-speed transistors such as drift transistors while for lower frequency applications alloy-junction transistors may be utilized.

*Explanation of Operation of FIGURE 3—Pulse Generator*

The operation of the pulse generator of FIGURE 3 is quite similar to that of the circuit of FIGURE 1 except for the type of feedback. When power is first applied to the circuit, a surge of current is translated by the transistor 11 and this shock excites the resonant circuit 31, 14 associated with the collector of the transistor. As the collector of the transistor becomes more positive, a negative-going wave is applied to the base of the transistor and this causes it to conduct more heavily. By emitter follower action, the interconnected emitter electrodes of the transistors become more negative than the previous value and this is effective to maintain the transistor 25 momentarily in a nonconductive state. The magnitude of the current translated by the transistor 11, which is largely determined by the value of the resistor 22, is such that the transistor is not driven into its saturated region and the transformer 30 does not saturate.

Since an oscillatory signal is developed in the circuit 31, 14 at the collector of the transistor 11, when this signal reverses in polarity a positive voltage excursion is applied to the base electrode of the transistor, thus momentarily rendering the transistor 11 nonconductive. The diodes 17 and 18 afford symmetrical limiting of the voltage wave applied to the base electrode of the transistor and keep the magnitude of this voltage swing within a range which will not damage the emitter-base junction of the transistor. Again by emitter-follower action, the interconnected emitter electrodes of the transistors 11 and 25 become more positive momentarily, and this is in a sense to render the transistor 25 fully conductive very abruptly, thus switching the current flow from one current-translating path through the transistor 11 to the parallel path including the transistor 25. As a result there appears a positive-going pulse at the output terminals 28, 28 associated with the collector of the transistor 25. When the voltage excursion appearing on the base electrode of transistor 11 becomes more negative as a result of feedback from the tuned circuit 21, 14, the transistor 11 is rendered fully conductive in the manner previously described and the transistor 25 becomes nonconductive. The cycle of operation explained above is repeated and a series of positive-going output pulses are developed at the output terminals of the pulse generator.

The current-switching techniques employed in the pulse generator of FIGURE 3 affords important benefits realized by the generator of FIGURE 1.

Figure 4:
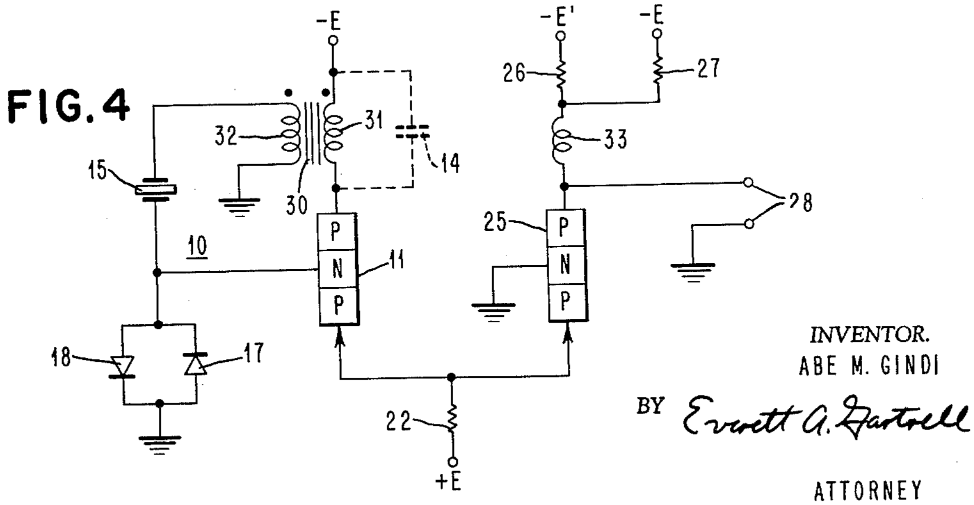
FIGURE 4 is a circuit diagram of another modification of the present invention.

*Description of Pulse Generator of FIGURE 4*

FIGURE 4 is a circuit diagram of a pulse generator which is generally similar to that of FIGURE 3. Accordingly, corresponding elements in the FIGURE 3 circuit are designated by the same reference numerals employed in FIGURE 3. The FIGURE 4 circuit is essentially the same as that of FIGURE 3 and differs therefrom only in the use of a piezo-electro crystal 15 which is connected between the ungrounded terminal of the secondary winding 32 of the transformer 30 and the base electrode of the transistor 11. The high Q crystal serves accurately to establish the pulse repetition rate of the pulses supplied by the generator. The operation of the pulse generator of FIGURE 4 is essentially the same as that of the FIGURE 3 device and hence need not be repeated.

While applicant does not wish to be limited to any particular set of circuit constants, the following constants have proved to be useful in a pulse generator of the type represented in FIGURE 1:

| | |
|---|---|
| Resistor **16** | 2 kilohms. |
| Resistor **22** | 910 ohms. |
| Resistor **26** | 2.4 kilohms. |
| Resistor **27** | 270 ohms. |
| Inductor **13** | 10 microhenries. |
| Capacitor **14** | 150 micromicrofarads. |
| Capacitor **19** | 33 micromicrofarads. |
| Inductor **33** | 2.7 microhenries. |
| Diodes **17** and **18** | Type IN–152 Hughes Aircraft Corp. |
| Transistors **11** and **25** | Type 015 PNP Drift, Int. Bus. Machines Corp. |
| Crystal **15** | 5 megacycle resonant frequency. |
| +E | +6 volts. |
| −E | −6 volts. |
| −E′ | −12 volts. |
| Output pulses | 2 volts at a 5 megacycle rate; rise and fall time, about 15 millimicroseconds. |

Pulse generators of the type described in FIGURE 1 have been successfully operated at other frequencies in the megacycle range using drift transistors and have been operated at frequencies in the kilocycle range using alloy-junction transistors with an appropriate crystal 15 and tuned circuit 12. Similar operation has been experienced with the pulse generators of FIGURES 3 and 4.

From the foregoing, it will be seen that since the transistors of a pulse generator in accordance with the present invention do not operate in their saturation region, the generator is capable of developing output pulses having steep leading and trailing edges and also at a very high repetition rate. Such a pulse generator is also capable of developing rectangular output pulses in the lower-frequency ranges.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims:

What is claimed is:

1. A free-running rectangular wave pulse generator comprising a regenerative oscillatory system including a single asymmetrically conductive device responsive to supplied currents for generating sustained oscillations having a predetermined frequency, current-translating means including an asymmetrically conductive device, a common constant-current source connected to said devices for supplying current thereto, and means responsive to a characteristic of said oscillations for alternately switching substantially the entire current flow from said source through individual ones of said devices.

2. A pulse generator in accordance with claim 1 in which at least one of said asymmetrically conductive devices is a transistor.

3. A pulse generator in accordance with claim 1 in which said asymmetrically conductive devices are transistors and in which said characteristic of said oscillations is the polarity thereof.

4. A pulse generator in accordance with claim 1 in which said asymmetrically conductive devices are transistors of the same conductivity type.

5. A free-running rectangular wave pulse generator comprising a regenerative oscillatory system which includes a single transistor and regenerative feedback means including the inherent collector-emitter and base-emitter capacitances of said transistor and which is responsive to supplied currents for generating sustained oscillations having a predetermined frequency, current-translating means including a transistor having signal-output means coupled thereto, a common constant-current source connected to said transistors for supplying current thereto, and means responsive to the polarity of said oscillations for alternately switching substantially the entire current flow from said source through individual ones of said transistors to develop output pulses having said frequency at said signal-output means.

6. A pulse generator comprising a regenerative oscillatory system including a transistor having emitter, base, and collector electrodes, a frequency-determining piezoelectric crystal for said generator coupled between said collector and base electrodes, a parallel-resonant circuit resonant at frequency below that of said crystal connected to said collector electrode in the current-translating path of said transistor, and regenerative feedback means including the internal capacitances between said collector and emitter electrodes and between said base and emitter electrodes, said system being responsive to supplied current for generating oscillations, current-translating means including a transistor having emitter, base, and collector electrodes with said base electrode connected to a point of reference potential, and output circuit means connected to said last-mentioned collector and base electrodes, a common constant-current source connected to said emitter electrodes for supplying current to said transistors, and means responsive to the polarity of said oscillations for alternately switching substantially the entire current flow from said source through individual ones of said transistors to develop output pulses at said signal output means.

7. A pulse generator in accordance with claim 6 in which said transistors are drift transistors and in which said first-mentioned transistor includes a resistor and pair of oppositely poled asymmetrically conductive devices connected between said base electrode thereof and said point of reference potential.

8. A pulse generator in accordance with claim 6 in which said first-mentioned transistor includes a capacitor connected between the base thereof and said point of reference potential for augmenting said internal capacitances of said first-mentioned transistor to assure regeneration.

9. A free-running rectangular wave pulse generator comprising a constant-current source, a pair of branch circuits connected in parallel with each other and in series with said source, one of said circuits comprising a regenerative oscillatory system including only one asymmetrically conductive device poled to conduct current from said source in its low impedance direction and the other comprising a similarly poled second asymmetrically conductive device, and means responsive to a characteristic of the oscillations developed by said oscillatory system for concurrently changing the conductivity of either of said devices in a sense opposite to that of the other thereof to develop output pulses having the frequency of said oscillations.

10. A free-running rectangular wave pulse generator comprising a constant-current source, a pair of branch circuits connected in parallel with each other and in series with said source, one of said circuits comprising a regenerative oscillatory system including only one transistor device poled to conduct crurent from said source in its low impedance direction and the other comprising a similarly poled asymmetrically conductive device, and means periodically responsive to a characteristic of the oscillations developed by said oscillatory system for concurrently changing the conductivity of either of said devises in a sense opposite to that of the other thereof to develop output pulses having the frequency of said oscillations.

11. A free-running rectangular wave pulse generator comprising a constant-current source, a pair of branch circuits connected in parallel with each other and in series with said source, one of said circuits comprising a regenerative oscillatory system including only one transistor poled to conduct current from said source in its low impedance direction and the other comprising a similarly poled second transistor having signal output means, and means responsive to the polarity of the oscillations developed by said oscillatory system for concurrently changing the conductivity of either of said transistors in a sense opposite to that of the other thereof to develop output pulses having the frequency of said oscillations at said output means.

12. A free-running rectangular wave pulse generator comprising a constant-current source, a pair of branch circuits connected in parallel with each other and in series with said source, one of said circuits comprising a regenerative oscillatory system including only one transistor of a predetermined conductivity type for conducting current from said source and the other comprising a second transistor of said type for conducting current from said source, and means responsive to a characteristic of the oscillations developed by said oscillatory system for alternately switching substantially the entire current flow from said source through individual ones of said transistors.

13. A rectangular wave pulse generator comprising a free-running oscillator including a single transistor responsive to supplied currents for generating sustained oscillations having a predetermined frequency, current-translating means including a transistor having signal-output means coupled thereto, a common constant-current source connected to said transistors for supplying current thereto, and means responsive to the polarity of said oscillations for alternately switching substantially the entire current flow from said source through individual ones of said transistors to develop output pulses at said signal-output means having said frequency and symmetrical leading and trailing edges.

14. A rectangular wave pulse generator comprising a regenerative oscillatory system including a single transistor having emitter, base, and collector electrodes, and regenerative inductive feedback means between said collector and base electrodes for generating sustained oscillations having a predetermined frequency in said system, current-translating means including a transistor having emitter, base, and collector electrodes, said base electrode being connected to a reference potential point, and signal-output means coupled between said collector electrode and said point, a common constant-current source connected to said emitter electrodes for supplying current to said transistors, and means responsive to the polarity of said oscillations for alternately switching substantially the entire current flow from said source through individual ones of said transistors to develop output pulses at said signal-output means having the frequency of said oscillations.

15. A pulse generator in accordance with claim 14 in which said responsive means includes the emitter electrodes of said transistors.

16. A pulse generator in accordance with claim 15 in which said inductive feedback means is a transformer having a primary winding connected to said collector electrode of said first-mentioned transistor and a secondary winding connected between said reference potential point and said base electrode thereof, and in which a pair of oppositely poled diodes are connected in parallel between said electrode just mentioned and said point.

17. A pulse generator in accordance with claim 16 in which a piezo-electric crystal determining the frequency of said generator is connected in series with said secondary winding between said point and said base electrode.

References Cited in the file of this patent

UNITED STATES PATENTS 2,825,810 Zeidler ---------------- Mar. 4, 1958

(Other references on following page)

UNITED STATES PATENTS

| | | |
|---|---|---|
| 2,825,821 | Logue | Mar. 4, 1958 |
| 2,851,604 | Clapper | Sept. 9, 1958 |
| 2,863,956 | Schmidt | Dec. 9, 1958 |
| 2,880,331 | MacSorley | Mar. 31, 1959 |
| 2,939,018 | Faulkner | May 31, 1960 |
| 2,967,953 | Pribble | Jan. 10, 1961 |

OTHER REFERENCES

Article "Portable Transistor Frequency Standard" by Donald Beyer, pages 194 and 196, Electronics June 1, 1957.